United States Patent [19]
Willard et al.

[11] Patent Number: 4,591,942
[45] Date of Patent: May 27, 1986

[54] CURRENT SENSING TRANSFORMER ASSEMBLY

[75] Inventors: Henry G. Willard, Wethersfield, Conn.; Thomas E. Anderson, Highland Heights, Ohio

[73] Assignee: General Electric Company, New York, N.Y.

[21] Appl. No.: 679,660

[22] Filed: Dec. 7, 1984

[51] Int. Cl.$^4$ .................. H02H 3/08; H01F 40/06
[52] U.S. Cl. .................... 361/97; 336/174; 336/223
[58] Field of Search ............. 361/43, 44, 45, 97; 336/173, 174, 175, 192, 213, 223

[56] References Cited

U.S. PATENT DOCUMENTS

| 1,866,345 | 7/1932 | Callsen | 336/175 X |
| 2,532,100 | 11/1950 | Howell | 336/213 X |
| 2,924,796 | 2/1960 | Stauber et al. | 336/175 X |
| 3,268,843 | 8/1966 | Popp | 336/175 X |
| 3,725,741 | 4/1973 | Misencik | 336/174 X |
| 4,266,259 | 5/1981 | Howell | 361/97 |

FOREIGN PATENT DOCUMENTS 1437664  3/1966  France ............... 336/192

Primary Examiner—Thomas J. Kozma
Attorney, Agent, or Firm—Richard A. Menelly; Walter Bernkopf; Fred Jacob

[57] ABSTRACT

A current sensing transformer useful for sensing overload current with static trip units is fabricated from an inexpensive array of transformer core laminations and a conventional secondary transformer winding. The transformer primary strap is arranged about the secondary winding for improved flux transfer.

6 Claims, 5 Drawing Figures

CURRENT SENSING TRANSFORMER ASSEMBLY

BACKGROUND OF THE INVENTION

Static trip units such as that described within U.S. Pat. No. 4,266,259 entitled "Long-time and Short-time Overcurrent Signal Processor For Circuit Breaker Static Trip Units" to E. K. Howell, employ a current transformer for monitoring the current within a protected circuit. When such a trip unit also includes ground fault protection function and the line sensing transformer is used to sense ground fault currents, a highly accurate current transformer is required. The transformer generally consists of a so-called "wound core" wherein the secondary winding comprises a toroidal winding which is arranged to optimize the transformer efficiency to less than one percent maximum error under calibrated test conditions. A current transformer having a toroidal secondary winding is described, for example, in U.S. Pat. No. 3,449,703 entitled "Current Transformer Having An Accuracy Unimpaired By Stray Flux From Adjacent Conductors" to F. L. Steen.

With the advent of minimum function circuit interrupters without ground fault function wherein the thermal and magnetic response characteristics of molded case circuit breakers are provided within a static trip unit with electronics, such an accurate current sensor is no longer required. The minimum function circuit interrupter employs an analog signal processor similar to that described within the Howell patent to perform long-time, short-time and instantaneous trip functions. It is contemplated that the minimum function static trip unit will be employed within circuit breaker frame ratings lower than those currently utilizing the Howell static trip unit. Further, since ground fault protection is not required, a less expensive current sensing transformer would be highly desirable. It is known that laminated core transformers are less expensive to fabricate than the earlier described wound core and that transformer windings obtained from a simple bobbin machine are substantially less expensive than the earlier described toroidal winding. To date, laminated core current transformers have not proven feasible as current sensors within electronic trip units because of their low accuracy as determined by calibrated test techniques in comparison to the more sophisticated current transformers. The poor performance obtained with laminated core current transformers having simple bobbin secondary windings is caused by the leakage flux through that portion of the core which is exposed between the primary strap and the secondary winding.

The purpose of this invention is to provide a low cost current sensor having good transfer characteristics for minimum function static trip units by utilizing a bobbin wound secondary winding on a laminated transformer core and increasing the flux transfer between the primary strap and the secondary winding.

SUMMARY OF THE INVENTION

A current sensor for non-ground fault function static trip units or ground fault trip units that use zero sequence sensors is provided by arranging the primary strap around a bobbin wound secondary winding utilizing a laminated core. With both the primary strap and secondary winding extending through the core aperture and arranged on a common core leg, the primary strap couples the magnetic flux with the secondary winding for substantially improved response.

DESCRIPTION OF THE PREFERRED EMBODIMENT

Figure 1A:
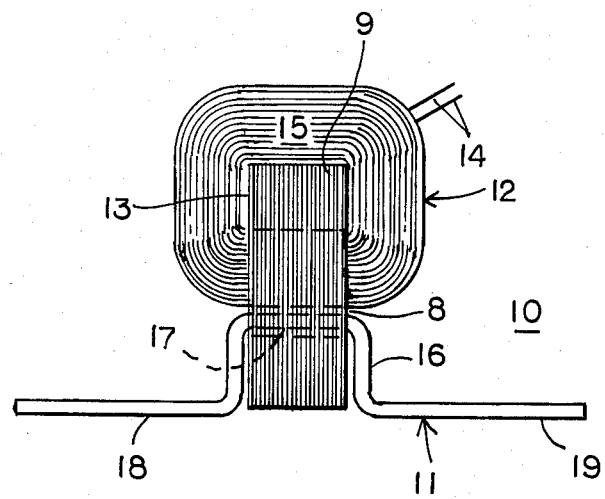
FIG. 1A is a side view of a known current transformer having laminated core.
Figure 3:
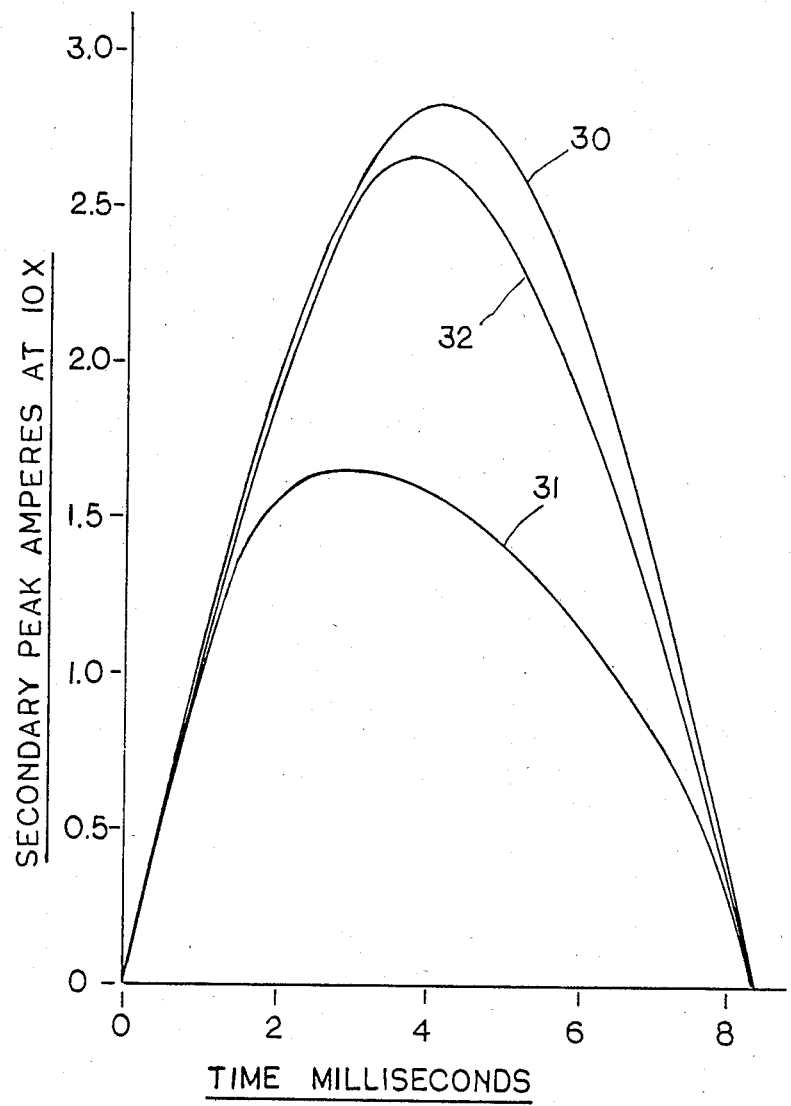
FIG. 3 is a graphic representation comparing the accuracies of the transformers of FIGS. 1A, 1B and 2A, 2B.

FIG. 1A contains a current transformer 10 of the type utilizing a primary strap 11 such as a formed metal bus bar inserted within an aperture 8 of a core 13. The core contains a plurality of laminations 9 formed from thin sheets of a magnetic material. A secondary winding or windings 12 is arranged through the core aperture and consists of a plurality of insulated wire turns 15 which are formed on a simple bobbin from an insulated wire using a bobbin winding machine. A pair of secondary leads 14 comprising the two opposite ends of the continous strand provides the output current from the secondary winding and a first terminal connecting portion 18 and a second terminal connecting portion 19 of the primary strap 11 provide connection to the primary strap. Multiple secondary windings which include taps are sometimes employed to scale the output current to desired values. The primary strap is formed having a U-shaped body portion 16 wherein the bight portion 17 is arranged within the core aperture. The arrangement of the primary strap 11 and the secondary winding 12 within the core aperature 8 is best seen by referring to FIG. 1B. The laminated core 13 is of the type consisting of a rectangle having four legs (a–d) such that the primary strap 11 is arranged around the d leg and the secondary winding 12 is arranged around the b leg. It is noted that legs (a,c) which extend between the primary strap and the secondary winding are exposed and result in the generation of high leakage flux levels not effectively coupling the primary strap and the secondary winding. When this configuration is tested for transformation efficiency by connecting the first and second terminal connecting portions 18, 19 in series with a calibrated current source and reading the secondary peak current between the secondary leads 14 at a given period of time, the result is shown at 31 in FIG. 3. The calculated percent maximum error for these test conditions is 41 percent.

Figure 1B:
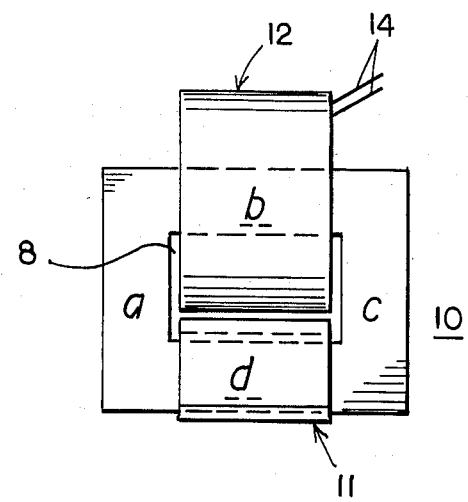
FIG. 1B is an axial view of the current transformer depicted in FIG. 1.
Figure 2A:
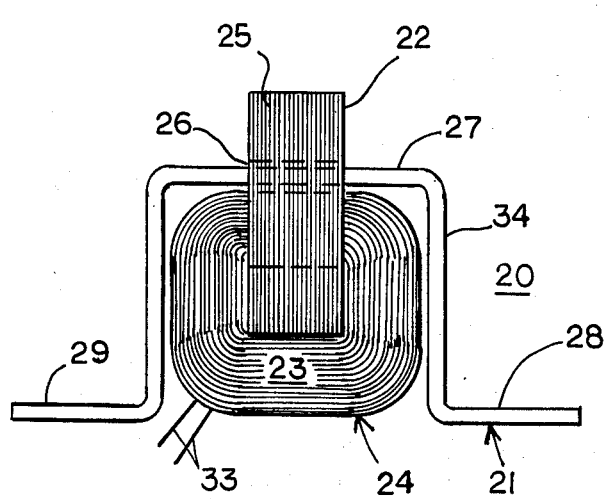
FIG. 2A is a side view of the laminated core current transformer according to the invention.
Figure 2B:
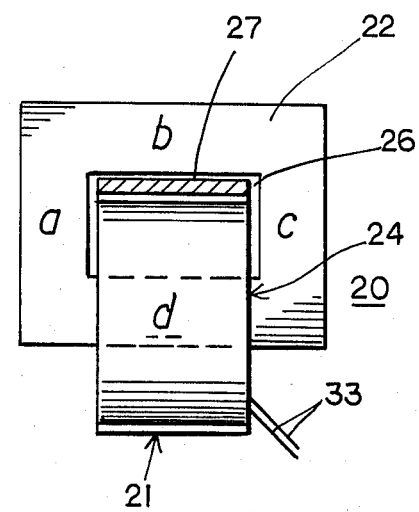
FIG. 2B is an axial view of the current transformer depicted in FIG. 2A.

FIG. 2A shows an "inverted" laminated core current transformer 20 wherein the primary strap 21 having the configuration of U-shaped body 34 and a first and second terminal connecting portion 28, 29 with the bight portion 27, extends through the aperture 26 of a laminated core 22. The laminated core has a plurality of transformer core laminations 25 similar to those described earlier with reference to FIG. 1A. In the inverted arrangement shown here, the secondary winding 24 having a plurality of insulated wire turns 23 and a pair of secondary leads 33 similar to that described with reference to FIG. 1A, is now located under the U-shaped body 34 of the primary strap 21. The inverted arrangement of the primary strap 21, secondary winding 24 and laminated core 22 can best be seen by referring now to FIG. 2B. The laminated core 22 comprises a rectangle having four legs (a–d) similar to that described with reference to FIG. 1B. In this arrangement, however, both the primary strap 21 and the secondary winding 24 are arranged around the same leg d of the laminated core 22. In this arrangement three legs of the core (a–c) are exposed. However, the arrangement of the primary strap over the secondary winding efficiently couples the magnetic flux between the primary strap and the secondary winding. The flux generated between the primary strap and the secondary winding which otherwise would comprise "leakage" flux with the configuration depicted in FIGS. 1A, 1B is now efficiently coupled between the primary strap and the secondary winding. When a similar calibrated test current is placed in series with the first and second terminal connecting portions 28, 29 of the primary strap 21 the secondary peak current occurring between secondary leads 33 has the configuration depicted at 32 in FIG. 3. This represents a seven percent maximum error compared to the forty one percent error measured with the configuration shown in FIGS. 1A, 1B. When a precision wound toroidal winding on a formed core used with the static trip circuit described within the Howell Patent is tested under the same conditions, the secondary peak current has the configuration depicted at 30 in FIG. 3. This represents a one percent maximum error under the same test conditions. A typical test condition for a 600 amp current transformer measured at full-scale current is 10× or 6000 amps.

It is thus shown that the inverted laminated core configuration of the instant invention provides a substantial improvement over laminated current transformers wound in a non-toroidal straight bobbin configuration. It is believed that the seven percent maximum error at 10×-scale reading is more than satisfactory for use as a current sensor within minimum function static trip units as hereinbefore described.

Having described our invention, what we claim as new and desire to secure by Letters Patent is:

1. A current transformer comprising:
   a conductive primary strap having a U-shaped body inserted within a four-legged apertured magnetic cord; and
   a secondary winding completely subjacent said U-shaped body and arranged around one of said four core legs for coupling magnetic flux between said primary strap and said secondary winding, said U-shaped primary strap having bight portion, said bight portion inserted within said aperture over said secondary winding, said U-shaped body encompassing three sides of said secondary winding.

2. The current transformer of claim 1 wherein said primary strap further comprises a metal bus bar having a pair of first and second opposing terminal end portions extending from the U-shaped body.

3. The current transformer of claim 1 wherein said apertured core comprises a plurality of stacked magnetic laminations arranged within each of said four legs.

4. The current transformer of claim 1 wherein said secondary winding comprises a continous strand of insulated wire wound around said one core leg, a first end of said strand comprising a first secondary lead, and a second end of said strand comprising a second secondary lead.

5. The current transformer of claim 1 wherein said secondary winding comprises multiple secondary windings.

6. A static trip unit for circuit interrupter comprising:
   electronic signal processor means for determining overload current conditions within a protected circuit and for providing an output signal to operate a pair of contacts to interrupt current flow through said circuit; and a
   current transformer connected within said protected circuit and to said electronic signal processor for providing input signal processor in proportion to said current flow through said circuit, said transformer comprising:
   a four-legged laminated core transformer having an aperture defined by said four legs;
   a secondary winding arranged around one of said four legs from a continuous strand of insulated wire, a first end of said wire providing a first secondary lead and a second end of said wire providing a second secondary lead; and
   a U-shaped primary strap having a bight portion, said bight portion inserted within said transformer aperture over said secondary winding, said U-shaped body encompassing three sides of said secondary winding to provide efficient flux transfer between said secondary winding and said primary strap.

* * * * *